US008097922B1

(12) United States Patent
Balandin et al.

(10) Patent No.: US 8,097,922 B1
(45) Date of Patent: Jan. 17, 2012

(54) NANOMETER-SCALE TRANSISTOR ARCHITECTURE PROVIDING ENHANCED CARRIER MOBILITY

(75) Inventors: Alexander A. Balandin, Riverside, CA (US); Vladimir A. Fonoberov, Goleta, CA (US)

(73) Assignee: The Regents of the University of California, Oakland, CA (US)

( * ) Notice: Subject to any disclaimer, the term of this patent is extended or adjusted under 35 U.S.C. 154(b) by 117 days.

(21) Appl. No.: 11/754,618

(22) Filed: May 29, 2007

(51) Int. Cl.
*H01L 21/70* (2006.01)

(52) U.S. Cl. ........ 257/369; 438/172; 257/401; 257/347; 257/40

(58) Field of Classification Search ............... 438/172; 257/401, 347, 40.369
See application file for complete search history.

(56) References Cited

U.S. PATENT DOCUMENTS

| | | | | |
|---|---|---|---|---|
| 5,160,982 A * | 11/1992 | Goronkin et al. | ............... | 257/23 |
| 5,298,441 A * | 3/1994 | Goronkin et al. | ............. | 438/172 |
| 5,920,080 A * | 7/1999 | Jones | ............................ | 257/40 |
| 7,091,120 B2 * | 8/2006 | Buretea et al. | ................ | 438/602 |
| 7,102,179 B2 * | 9/2006 | Saito et al. | ..................... | 257/192 |
| 7,714,386 B2 * | 5/2010 | Pesetski et al. | ............... | 257/347 |
| 2007/0269968 A1* | 11/2007 | Saxler et al. | ................... | 438/522 |
| 2008/0108171 A1* | 5/2008 | Rogers et al. | ................... | 438/73 |

OTHER PUBLICATIONS

Cui, Yu et al., "Diameter-controlled Synthesis of Single-crystal Silicon Nanowires," Applied Physics Letters, Apr. 9, 2001, pp. 2214-2216, vol. 78, No. 15, American Institute of Physics.

Dennig, Paul A. et al., "Growth of Single Diamond Crystallites Around Nanometer-scale Silicon Wires," Appl. Phys. Lett., Aug. 14, 1995, pp. 909-911, No. 67 (7), American Institute of Physics.
Fonoberov, Vladimir A. et al., "Phonon Confinement Effects in Hybrid Virus-Inorganic Nanotubes for Nanoelectronic Applications," Nano Letters, 2005, pp. 1920-1923, vol. 5, No. 10, American Chemical Society.
Holmes, Justin D. et al., "Control of Thickness and Orientation of Solution-Grown Silicon Nanowires," Science, Feb. 25, 2000, pp. 1471-1473, vol. 287.
Huang, Yu et al., "Gallium Nitride Nanowire Nanodevices," Nano Letters, 2002, pp. 101-104, vol. 2, No. 2, American Chemical Society.
Lee, Johnson et al., "Low-field Electron Transport in Quasi-one-dimensional Semiconducting Structures," J. Phys. C: Solid State Phys., 1984, pp. 2525-2535, No. 17, The Institute of Physics.
Liu, H. I. et al., "Self-limiting Oxidation for Fabricating Sub-5 nm Silicon Nanowires," Appl. Phys. Lett., Mar. 14, 1994, pp. 1383-1385, No. 64 (11), American Institute of Physics.

(Continued)

*Primary Examiner* — Thanh V Pham
*Assistant Examiner* — Caleb Henry
(74) *Attorney, Agent, or Firm* — Withrow & Terranova, P.L.L.C.

(57) ABSTRACT

The present invention provides a nanometer-scale transistor architecture providing enhanced carrier mobility. In particular, a portion of a channel of a transistor is substantially surrounded with an acoustically hard material to form a barrier shell about the channel. The barrier shell functions to confine phonons in the channel. Confining the phonons in the channel reduces the extent to which atoms in the crystal lattice structure of the channel move as they vibrate. Restricting the extent that the atoms vibrate in the crystal lattice of the channel significantly reduces the scattering of electrons or holes traveling through the channel. In one embodiment of the invention, the thickness of the channel is in the order of the thermal phonon wavelength of the material forming the channel, and the barrier shell is acoustically harder than the channel. The benefits of the present invention may be provided without requiring strain engineering.

13 Claims, 5 Drawing Sheets

OTHER PUBLICATIONS

Pokatilov, E. P. et al., "Acoustic Phonon Engineering in Coated Cylindrical Nanowires," Superlattices and Microstructures, 2005, pp. 168-183, No. 38, Elsevier Ltd.

Pokatilov, E. P. et al., "Acoustic-phonon Propagation in Rectangular Semiconductor Nanowires with Elastically Dissimilar Barriers," Physical Review B, 2005, pp. 113311-1 to 113311-4, No. 72, The American Physical Society.

Sakaki, Hiroyuki, "Scattering Suppression and High-Mobility Effect of Size-Quantized Electrons in Ultrafine Semiconductor Wire Structures," Japanese Journal of Applied Physics, Dec. 1980, pp. L735-L738, vol. 19, No. 12.

Sun, L. T. et al., "Synthesis and Characterization of Diamond Nanowires from Carbon Nanotubes," Diamond and Related Materials, 2005, pp. 749-752, No. 14, Elsevier B. V.

Wu, Yue et al., "Controlled Growth and Structures of Molecular-Scale Silicon Nanowires," Nano Letters, 2004, pp. 433-436, vol. 4, No. 3, American Chemical Society.

Yu, Segi et al., "Electron Interaction with Confined Acoustic Phonons in Cylindrical Quantum Wires via Deformation Potential," J. Appl. Phys., Sep. 1, 1996, pp. 2815-2822, No. 80 (5), American Institute of Physics.

Zhang, Y. F. et al., "Deposition of Carbon Nanotubes on Si Nanowires by Chemical Vapor Deposition," Chemical Physics Letters, Nov. 3, 2000, pp. 48-52, No. 330, Elsevier Science B.V.

* cited by examiner

NANOMETER-SCALE TRANSISTOR ARCHITECTURE PROVIDING ENHANCED CARRIER MOBILITY

FIELD OF THE INVENTION

The present invention relates to transistors, and in particular to nanometer-scale transistor architectures providing enhanced carrier mobility.

BACKGROUND OF THE INVENTION

Transistors, such as field effect transistors (FETs), have become ubiquitous in modern electronics and are employed to perform amplifier or switching functions in applications ranging from power amplifiers to digital processors. In many applications, either the need for additional functionality or miniaturization has led to aggressive downsizing of transistors. Unfortunately, the physical laws and material limits prevent continuous downsizing and require new approaches for increasing speed and functionality.

In general, FETs rely on an electric field applied at a gate terminal to control the conductivity of a semiconductor channel extending between the source and drain terminals of the transistor. The electrical conductivity of the semiconductor channel corresponds to the rate at which electrons or holes flow between the source and drain terminals, and has a direct impact on the performance and switching speeds of the FET. The flow of electrons or holes in the semiconductor channel is governed by the carrier mobility, a parameter, which defines how fast electrons or holes react to an applied electric field. Unfortunately, aggressive downsizing of FETs makes it hard to maintain the carrier mobility within the semiconductor channel, since the physical size of the semiconductor channel impacts carrier mobility. All things being equal, as the size of the semiconductor channel decreases, the room-temperature carrier mobility within the semiconductor channel decreases.

Strain engineering has been employed to improve carrier mobility in the relatively small semiconductor channels. The crystal lattice of the material forming a semiconductor channel is formed from an atomic structure. With strain engineering, thin films are applied to either side of a channel layer that provides the semiconductor channel. The thin films and the channel layer will have different lattice structures, and in particular, the bonds between atoms in the thin films will normally have different spacing than the bonds between the atoms in the channel layer. The thin films and the channel layer are formed such that the thin films on either side of the channel layer either stretch or compress the bonds between the atoms in the crystal lattice of the channel layer. Interestingly, certain types of FETs benefit from placing the channel layer under tension, while others benefit from compression. For example, electron mobility in P-type FETs increases when the channel layer is under tension, while hole mobility increases in N-type FETs when the channel layer is under compression.

In complementary metal-oxide semiconductor (CMOS) processes, N-type and P-type transistors are paired in a complementary and symmetrical fashion to provide various logic functions. To benefit from the enhanced carrier mobility provided by strain engineering, the individual N- and P-type FETs on a given wafer must be subjected to either tension or compression. Having to provide different types of strain to large numbers of FETs on a given wafer significantly increases process complexity, reliability, and expense.

Although strain engineering improves carrier mobility, thermal performance suffers. Layers of silicon germanium (SiGe) or other alloys of silicon (Si) are often used as the thin films for a silicon-based semiconductor channel. Silicon germanium and the other alloys are generally poor thermal conductors relative to the semiconductor channel and surrounding layers. For example, silicon germanium has a thermal conductivity an order of magnitude less than that of silicon. As such, application of strain engineering significantly reduces the efficiency at which heat is transferred out of the semiconductor channel, thereby limiting operating speeds and current handling.

Accordingly, there is a need for an efficient and effective technique to improve carrier mobility in transistor architectures without requiring strain engineering techniques. There is a further need for a technique to improve carrier mobility without significantly degrading thermal performance of the transistor architectures. There is also a need for improved carrier mobility while maintaining thermal performance in small-scale transistor architectures.

SUMMARY OF THE INVENTION

The present invention provides a nanometer-scale transistor architecture providing enhanced carrier mobility. In particular, a portion of a channel of a transistor is substantially surrounded with an acoustically hard material to form a barrier shell about the channel. The barrier shell functions to confine phonons in the channel. Confining the phonons in the channel reduces the extent to which atoms in the crystal lattice structure of the channel move as they vibrate. Restricting the extent that the atoms vibrate in the crystal lattice of the channel significantly reduces the scattering of electrons or holes traveling through the channel. In one embodiment of the invention, the thickness of the channel is in the order of the thermal phonon wavelength of the material forming the channel, and the barrier shell is acoustically harder than the channel. The benefits of the present invention may be provided without requiring strain engineering. Further, the barrier shell may be selected from a material having a relatively high thermal conductivity, such that heat is readily transferred from the channel during operation.

Those skilled in the art will appreciate the scope of the present invention and realize additional aspects thereof after reading the following detailed description of the preferred embodiments in association with the accompanying drawing figures.

BRIEF DESCRIPTION OF THE DRAWING FIGURES

The accompanying drawing figures incorporated in and forming a part of this specification illustrate several aspects of the invention, and together with the description serve to explain the principles of the invention.

DETAILED DESCRIPTION OF THE PREFERRED EMBODIMENTS

Figure 1:
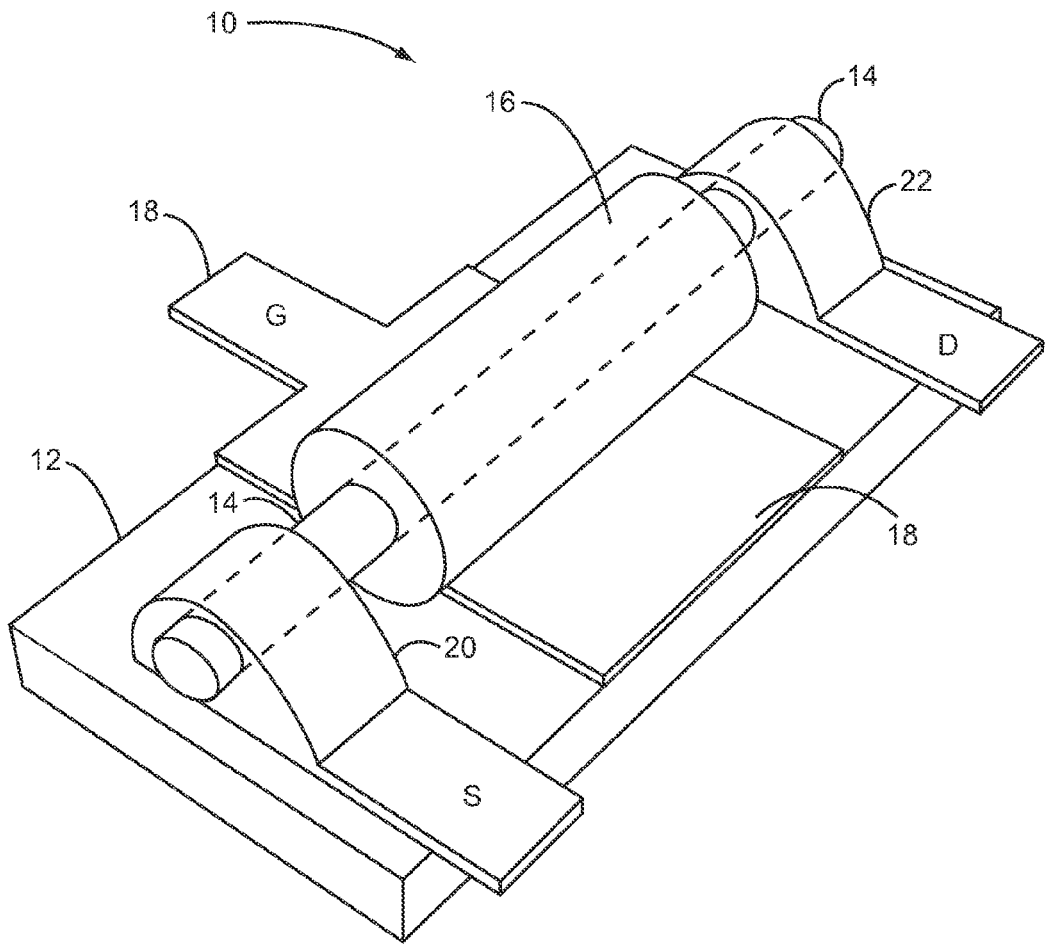
FIG. 1 illustrates an enhanced carrier mobility transistor employing a cylindrical nanowire channel according to one embodiment of the present invention.

The embodiments set forth below represent the necessary information to enable those skilled in the art to practice the invention and illustrate the best mode of practicing the invention. Upon reading the following description in light of the accompanying drawing figures, those skilled in the art will understand the concepts of the invention and will recognize applications of these concepts not particularly addressed herein. It should be understood that these concepts and applications fall within the scope of the disclosure and the accompanying claims.

The crystal lattice of the material forming the channel of a transistor is formed from a moving atomic structure. The atoms of the crystal lattice vibrate as a function of temperature. These atoms will vibrate throughout normal operating temperature ranges of the transistor. The vibrating atoms are constantly changing the paths that are available for carriers, either electrons or holes, to flow through the crystal lattice of the channel. In fact, the vibrating atoms tend to scatter carriers as they flow through the crystal lattice of the channel. The scattering of carriers significantly reduces the speed and efficiency at which carriers can travel through the channel, thereby reducing carrier mobility and overall transistor performance.

The effect of the vibrating movement of an atom may be characterized as a phonon, and as such, a phonon represents a quantized, particle-like unit of vibrating energy that is provided by an atom within a crystal lattice. Since the vibration of the individual atoms is a function of temperature, the movement of the atoms throughout the crystal lattice due to the vibrations is a wavelike resonance, and thus is associated with a thermal wavelength. When referencing phonons, this thermal wavelength is referred to as a thermal phonon wavelength, which will be described in further detail below.

The present invention provides a nanometer-scale transistor architecture providing enhanced carrier mobility. In particular, a portion of a channel of a transistor is substantially or completely surrounded with an acoustically hard material to form a barrier shell about the channel. The barrier shell functions to confine phonons in the channel. Confining the phonons in the channel reduces the extent to which atoms in the lattice structure of the channel move as they vibrate. Restricting the extent that the atoms vibrate in the crystal lattice of the channel significantly reduces the scattering of electrons or holes traveling through the channel and thus enhances carrier mobility. As will be described further below, the thickness of the channel may be in the order of the thermal phonon wavelength of the material forming the channel, and the barrier shell may be acoustically harder than the channel in preferred embodiments. Confining the phonons in the channel, and thus reducing atomic vibrations within the crystal lattice of the channel, significantly enhances carrier mobility. Further, the barrier shell may be selected from a material having a relatively high thermal conductivity, such that heat is readily transferred from the channel during operation.

With reference to FIG. 1, a first embodiment of an enhanced carrier mobility transistor 10 is illustrated. The enhanced carrier mobility transistor 10 employs a unique nanometer-scale architecture formed on a substrate 12. A characterizing trait of the enhanced carrier mobility transistor 10 depicted in FIG. 1 is the cylindrical nanowire channel 14, which is formed above the substrate 12 and provides the channel for the enhanced carrier mobility transistor 10. In this embodiment, a barrier shell 16 completely surrounds, or coats, a portion of the nanowire channel 14 in an FET configuration, and a gate structure 18 is formed between the nanowire channel 14 and the substrate 12. Notably, the barrier shell 16 may substantially surround a portion of the nanowire channel 14 and still improve carrier mobility. In this embodiment, the requisite gate insulator, which should isolate the gate structure 18 from the nanowire channel 14, is provided by the barrier shell 16. Those skilled in the art will recognize that additional materials may be provided between the gate structure 18 and the barrier shell 16 to provide a gate insulating effect. In this embodiment, the gate structure 18 is planar and covers a significant portion of the substrate 12 between a source structure 20 and a drain structure 22. The gate structure 18 (G), source structure 20 (S), and drain structure 22 (D) provide the three primary terminals for the FET embodiment of the enhanced carrier mobility transistor 10. Each of these structures may be formed from an appropriate metal, such as copper, gold, platinum, an alloy thereof, heavily doped polycrystalline silicon, or other heavily doped polycrystalline semiconductor. The nanowire (or like) channel 14 may be formed of materials including but not limited to silicon, germanium, gallium arsenide, indium arsenide, indium antimonide, gallium nitride, and other semiconductors with suitable electronic properties.

As noted above, the barrier shell 16 functions to confine phonons in the channel of the nanowire channel 14. To confine phonons throughout the nanowire channel 14, the nanowire channel 14 must be relatively small. In a preferred embodiment, the diameter D of the nanowire channel 14 is in the order of the thermal phonon wavelength of the material forming the nanowire channel 14. The thermal phonon wavelength is represented by $\lambda_0 = hV_L/k_BT$ where h is Planck's constant, $k_B$ is Boltzmann's constant, T is absolute temperature, $V_L$ is the longitudinal sound velocity within the channel, and $V_T$ is the transverse sound velocity within the channel. For silicon (Si), the longitudinal and transverse sound velocities are $8.43 \times 10^5$ centimeters/second and $5.84 \times 10^5$ centimeters/second, respectively. The thermal phonon wavelength $\lambda_0$ of silicon is approximately 1.5 nanometers at room temperature. If the diameter D (or thickness) of the nanowire channel 14 is made of silicon, the thermal phonon wavelength $\lambda_0$ at room temperature is approximately 1.5 nanometers. Since the diameter D of the nanowire channel 14 is preferably within the same order of the thermal phonon wavelength, the diameter D of the nanowire channel 14 is preferably on the order of one to ten nanometers.

High quality crystalline silicon nanowires with diameters as small as 2 nanometers have already been fabricated, as described in an article in *Applied Physics Letters* No. 64 (1994) entitled, "Self-Limiting Oxidation for Fabricating Sub-5 nm Silicon Nanowires," by H. I. Liu et al.; an article in *Science* Vol. 287, 1471-1473 (2000) entitled, "Control of Thickness and Orientation of Solution-Grown Silicon Nanowires," by J. D. Holmes et al.; an article in *Applied Physics Letters* No. 78, 2214 (2001) entitled, "Diameter-Controlled Synthesis of Single-Crystal Silicon Nanowires," by Y. Cui et al.; an article in *Science* Vol. 294, 1313 (2001) entitled, "Logic Gates and Computation from Assembled Nanowire Building Blocks," by Y. Huang et al.; and an article in *Nano Letters* No. 4, 433 (2004) entitled, "Controlled Growth and Structures of Molecular-Scale Silicon Nanowires," by Y. Wu et al., which are incorporated herein by reference in their entireties.

The silicon nanowires that are described in the above articles are generally either free-standing or coated with silicon dioxide (SiO$_2$). The longitudinal and transverse sound velocities V$_L$ and V$_T$ for silicon dioxide are 5.96×10$^5$ centimeters/second and 3.75×10$^5$ centimeters/second, respectively, and as such will not significantly impact the thermal phonon wavelength $\lambda_0$ of the resultant nanowire channel 14, if a silicon nanowire is coated or otherwise surrounded with silicon dioxide to form the nanowire channel 14.

Preferably, the barrier shell 16 is a coating or other material structure that is acoustically harder than the material used to form the nanowire channel 14. Notably, the barrier shell 16 may be formed from various materials, which may be diamond related materials or non-diamond related materials. Diamond related materials include but are not limited to diamond, crystalline diamond, polycrystalline diamond, microcrystalline diamond, nanocrystalline diamond, diamond-like carbon, tetrahedral amorphous carbon, graphite, and graphene-type materials. Non-diamond related materials include but are not limited to silicon carbide, aluminum nitride, gallium nitride, zirconium dioxide, calcium oxide, and other hard insulating or wide-band gap materials. The barrier shell may also be formed of other material compatible with silicon, or compatible with another material used to form the nanowire channel 14. Exemplary barrier shell materials include but are not limited to diamond, which are acoustically harder than the materials used to form the nanowire channel 14.

Acoustic hardness may be characterized in light of a concept of acoustic impedance $\eta$, which may be represented by $\eta = \rho V$, where $\rho$ is the mass density of the material and V is the sound velocity within the given material. Structures that are acoustically mismatched are those with different acoustic impedances, where the acoustic impedance of one material is greater than approximately 1.5 times, and preferably 2 times, that of the other material. In particular, acoustic mismatch $\zeta$ is the ratio of the acoustic impedance of the barrier shell $\eta_{barriershell}$ divided by the acoustic impedance of the nanowire channel 14 (or layer) $\eta_{nanowirechannel}$ ($\zeta = \eta_{barriershell}/\eta_{nanowirechannel}$). For the present invention, the barrier shell 16 and the nanowire channel 14 should be acoustically mismatched, wherein the acoustic impedance of the barrier shell 16 is greater than the acoustic impedance of the nanowire channel 14. Acoustic mismatching may be applied to acoustic impedances that are calculated with either longitudinal or transverse sound velocities V$_L$, V$_T$.

In summary, this first embodiment employs a nanowire channel 14 that has a diameter D in the order of the thermal phonon wavelength $\lambda_0$ of the material used to form the nanowire channel 14. When the nanowire channel 14 is fabricated on this scale, providing a barrier shell 16 that is mismatched with the nanowire channel 14 and acoustically harder than the nanowire channel 14 will effectively provide phonon confinement within the nanowire channel 14. Notably, such phonon confinement does not necessarily mean that all atomic vibrations are eliminated. Instead, phonon confinement sufficiently reduces atomic vibrations in the crystal lattice of the nanowire channel 14 enough to significantly improve carrier mobility through the nanowire channel 14.

To provide an example, assume that the barrier shell 16 is formed from diamond, and the nanowire channel 14 is formed from silicon. From Table 1, the two different acoustic mismatches may be calculated. The first acoustic mismatch is a longitudinal velocity acoustic mismatch $\zeta_L$, which is derived using the respective acoustic impedances of diamond and silicon in light of their longitudinal sound velocities. Based on these calculations, the longitudinal velocity acoustic mismatch ($\zeta_L = \rho V_L$(Diamond)/$\rho V_L$(Si)) is approximately 3.137. The second acoustic mismatch is a transverse velocity acoustic mismatch $\zeta_T$, which is derived using the respective acoustic impedances of diamond and silicon in light of their transverse sound velocities. Based on these calculations, the transverse velocity acoustic mismatch ($\zeta_T = \rho V_T$(Diamond)/$\rho V_T$(Si)) is approximately 3.313. Since the acoustic mismatch between a barrier shell 16 of diamond and a nanowire channel 14 of silicon is at least 3.137, there is a very strong acoustic mismatch. The mismatch in this example is definitely greater than 1.5, and is still significantly higher than the preferred acoustic mismatch of at least approximately 2. Thus, the condition of the barrier shell 16 being acoustically harder than the nanowire channel 14 is met.

TABLE 1

Acoustic Impedance Data for Select Materials

| Material | $\rho$ (g/cm$^3$) | V$_L$ (10$^5$ cm/s) | V$_T$ (10$^5$ cm/s) | $\rho$V$_L$ (10$^5$ g/cm$^2$s) | $\rho$V$_T$ (10$^5$ g/cm$^2$s) |
|---|---|---|---|---|---|
| Silicon (Si) | 2.329 | 8.43 | 5.84 | 19.6335 | 13.6014 |
| Germanium (Ge) | 5.323 | 4.87 | 3.57 | 25.9230 | 19.0031 |
| Diamond | 3.515 | 17.52 | 12.82 | 61.5828 | 45.0623 |
| Cubic Silicon Carbide (3C—SiC) | 3.21 | 9.5 | 4.1 | 30.4950 | 13.1610 |
| Hexagonal Silicon Carbide (6H—SiC) | 3.21 | 12.5 | 7.1 | 40.1250 | 22.7910 |
| Indium Arsenide (InAs) | 5.68 | 3.83 | 2.64 | 21.7544 | 14.9952 |
| Gallium Arsenide (GaAs) | 5.32 | 4.73 | 3.35 | 25.1636 | 17.8220 |
| Silicon Dioxide (SiO$_2$) | 2.2 | 5.96 | N/A | 13.1120 | N/A |
| Aluminum Nitride (Al$_2$O$_3$) | 2.6 | 9.81 | N/A | 25.5060 | N/A |

In another example, assume that the barrier shell 16 is formed from hexagonal silicon carbide (6H-SiC), and the nanowire channel 14 is formed from silicon. From Table 1, the two different acoustic mismatches may be calculated. The first acoustic mismatch is a longitudinal velocity acoustic mismatch $\zeta_L$, which is derived using the respective acoustic impedances of hexagonal silicon carbide and silicon in light of their longitudinal sound velocities. Based on these calculations, the longitudinal velocity acoustic mismatch ($\zeta_L = \rho V_L$(6H-SiC)/$\rho V_L$(Si)) is approximately 2.044. The second acoustic mismatch is a transverse velocity acoustic mismatch $\zeta_T$, which is derived using the respective acoustic impedances of hexagonal silicon carbide and silicon in light of their transverse sound velocities. Based on these calculations, the transverse velocity acoustic mismatch ($\zeta_L = \rho V_L$(SiC)/$\rho V_L$(Si)) is approximately 1.676. In this case, the longitudinal velocity acoustic mismatch is slightly larger than two, while the transverse velocity acoustic mismatch is less than two, but is still greater than 1.5. This pair of materials, hexagonal silicon carbide (6H-SiC) and silicon (Si), may still be considered acceptable based on the acoustic impedance test of the preferred embodiment. Those skilled in the art will recognize with testing that the acoustic mismatch parameters defined herein are flexible, and that certain pairs of materials may have acoustic mismatches as low as 1.5 and will still be good candidates for use in the present invention.

Figure 2:
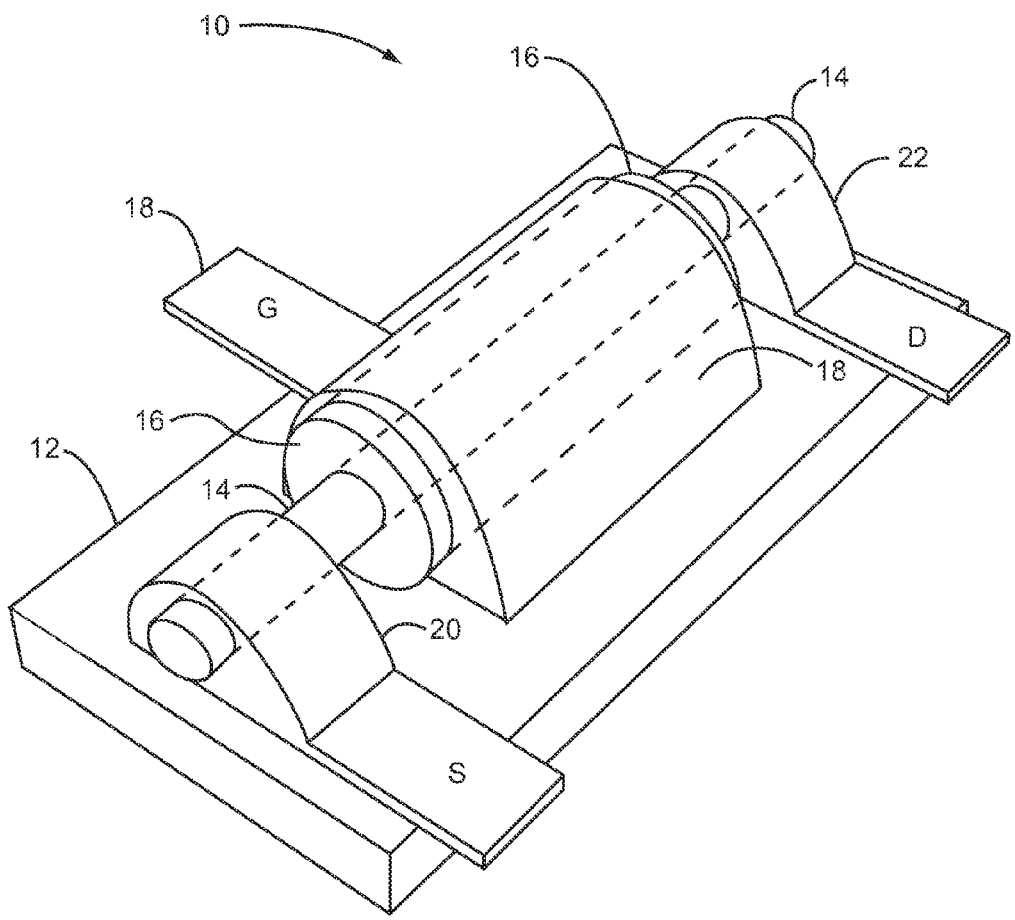
FIG. 2 illustrates an enhanced carrier mobility transistor employing a cylindrical nanowire channel according to a second embodiment of the present invention.
Figure 3:
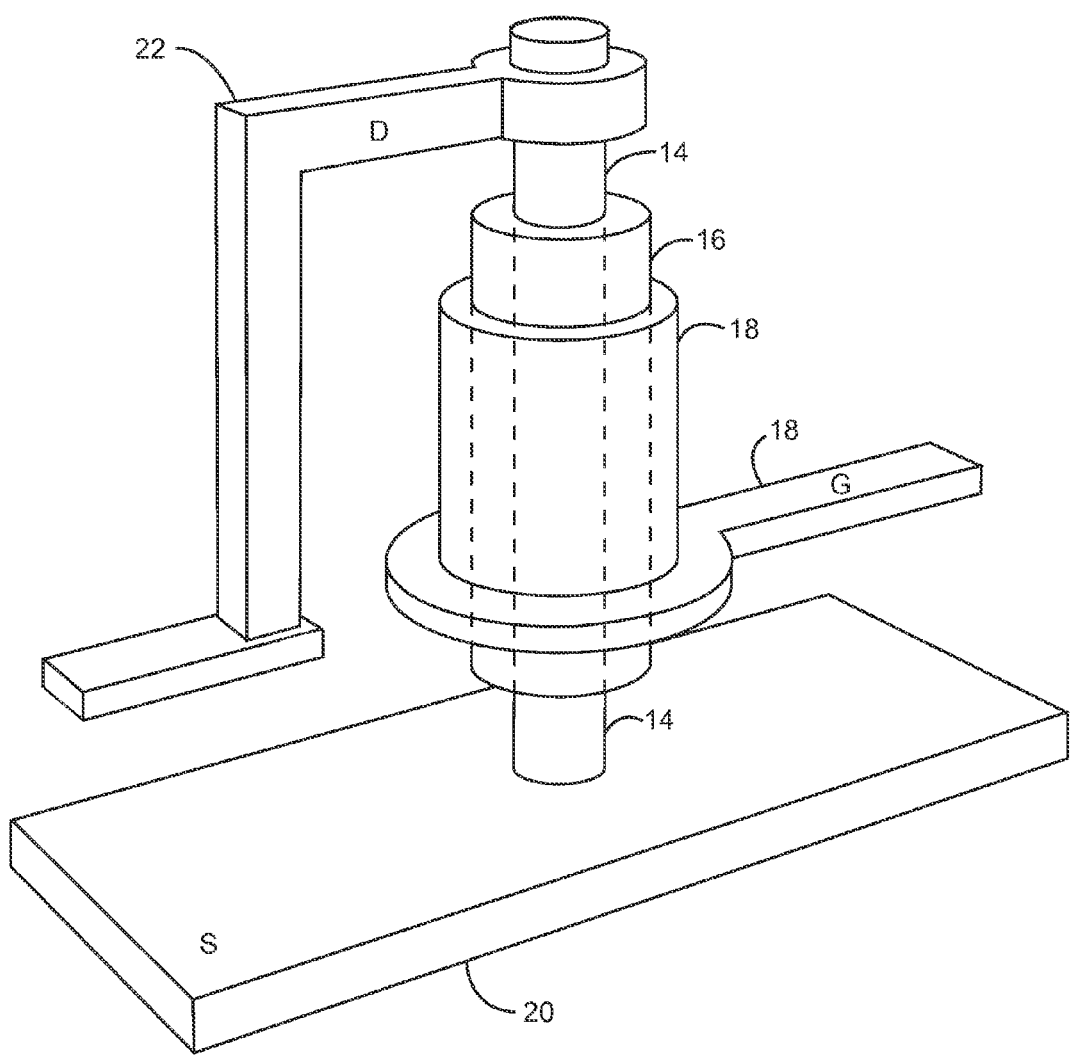
FIG. 3 illustrates an enhanced carrier mobility transistor employing a cylindrical nanowire channel according to a third embodiment of the present invention.

The concepts of the present invention may be employed in various architectures for enhanced carrier mobility transistors 10. For example, FIGS. 2 and 3 illustrate two more embodiments employing a cylindrical nanowire channel 14. With particular reference to FIG. 2, the gate structure 18 is not substantially planar. Instead, the gate structure 18 substantially surrounds the barrier shell 16. In such a structure, the electric field provided by a voltage appearing on the gate structure 18 is uniformly applied about the nanowire channel 14. In this embodiment, the nanowire channel 14 is parallel with the substrate 12.

With reference to FIG. 3, the cylindrical nanowire channel 14 is mounted perpendicular to the substrate 12 (not depicted). In this embodiment, an elongated drain structure 22 extends from one end of the nanowire channel 14, while the other end of the nanowire channel 14 extends into a source structure 20, which is substantially planar. Like the embodiment of FIG. 2, the gate structure 18 substantially, if not completely, surrounds the barrier shell 16 and provides a tab that extends outward from the nanowire channel 14. Further, the barrier shell 16 may act as a gate insulator between the gate structure 18 and the nanowire channel 14. Like the embodiment of FIG. 1, the embodiments of FIGS. 2 and 3 provide a barrier shell 16 that substantially, if not completely, surrounds the nanowire channel 14 in a fashion that confines phonons and results in enhanced carrier mobility through the nanowire channel 14.

In addition to providing significant phonon confinement to increase carrier mobility, the present invention performs well thermally. In particular, the material used to form the barrier shell 16 may be selected to have a relatively high thermal conductivity. For example, those skilled in the art will appreciate the thermal efficiency of diamond and diamond-like materials. As such, heat generated by carrier flow through the nanowire channel 14 is readily transferred away from the channel by the barrier shell 16.

Figure 4:
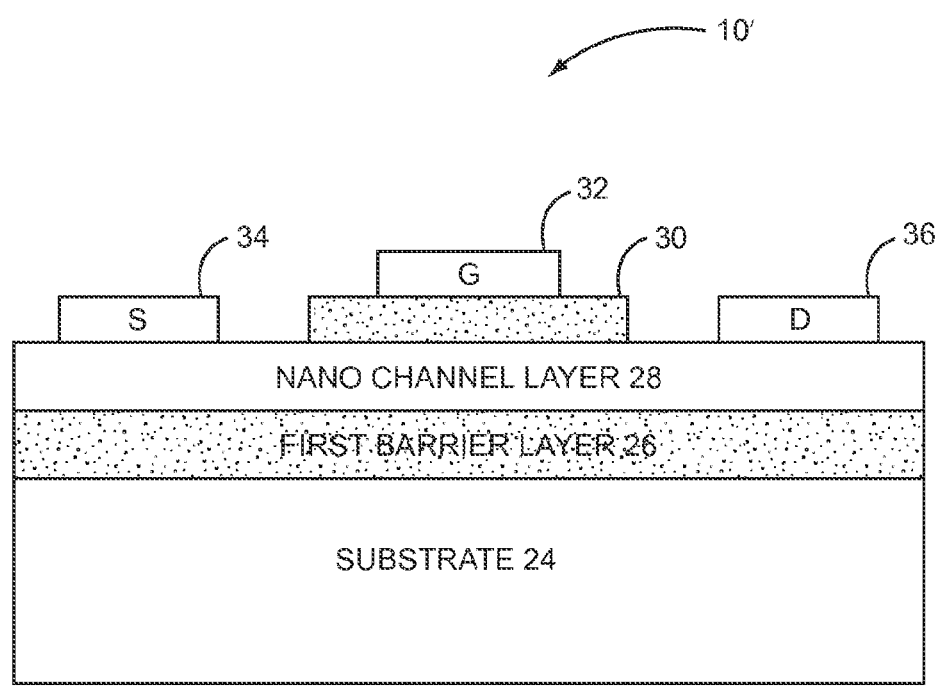
FIG. 4 illustrates an enhanced carrier mobility transistor employing a planar nanochannel according to a fourth embodiment of the present invention.

The concepts of the present invention are not limited to cylindrical nanowire channels 14. A more traditional planarized transistor architecture may also take advantage of the phonon confinement provided by the present invention. With reference to FIG. 4, an enhanced carrier mobility transistor 10' is formed on a substrate 24. A first barrier layer 26 is formed over the substrate 24, and a nanochannel layer 28 is formed on the first barrier layer 26. The nanochannel layer 28 may include a single layer of silicon or like material, or multiple layers of an appropriate channel material, such as silicon and silicon dioxide.

Notably, a second barrier layer 30 is formed on the nanochannel layer 28. A gate structure 32 is formed on top of the second barrier layer 30. The gate structure 32 and the second barrier layer 30 reside between a source structure 34 and a drain structure 36. A nanochannel, not referenced, is formed in the nanochannel layer 28 between the source structure 34 and the drain structure 36. Notably, the first barrier layer 26, the nanochannel layer 28, and the second barrier layer 30 are substantially planar; however, those skilled in the art will recognize that trenches may be etched along the nanochannel layer 28 on either side of the channel to be formed in the nanochannel layer 28, and subsequently filled with the material used for the second barrier layer 30. Thus, the channel within the nanochannel layer 28 may be completely surrounded by the material used to form the first barrier layer 26 and the second barrier layer 30. However, those skilled in the art will recognize that such trenching is not required, and the benefits of phonon confinement may be provided even when a portion of the actual channel within the nanochannel layer 28 is substantially, but not completely, surrounded with the first or second barrier layers 26, 30.

Figure 5:
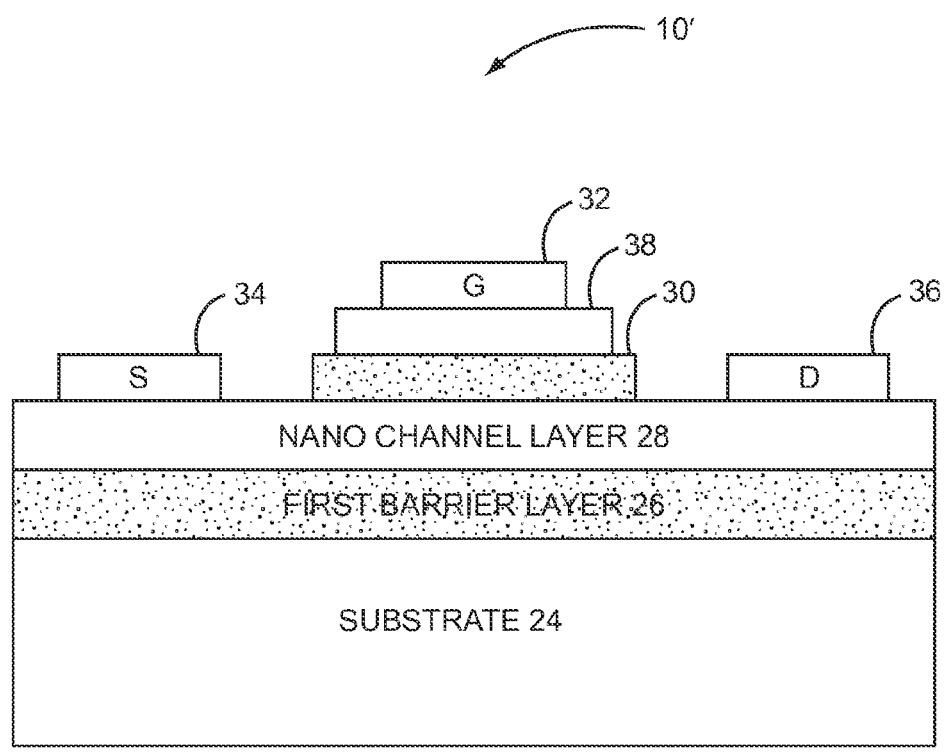
FIG. 5 illustrates an enhanced carrier mobility transistor employing a planar nanochannel according to a fifth embodiment of the present invention.

Functionally, the first barrier layer 26 and the second barrier layer 30 form a barrier shell substantially around, if not completely around, the channel within the nanochannel layer 28 that resides between the source structure 34 and the drain structure 36. If the conditions set forth above for a cylindrical nanowire channel 14 are abided by, significant phonon confinement will result in the channel formed in the nanochannel layer 28. Thus, phonon confinement may take place in cylindrical and planar architectures. In the embodiment illustrated in FIG. 4, the second barrier layer 30 may act as a gate insulator to insulate the gate structure 32 from the nanochannel layer 28 within which the channel is provided. With reference to FIG. 5, a planar architecture for an enhanced carrier mobility transistor 10' is illustrated wherein an additional gate insulator 38 is provided between the gate structure 32 and the second barrier layer 30.

In one embodiment, the thickness of the nanochannel layer 28 is in the order of the thermal phonon wavelength of the material forming the nanochannel layer 28. This will ensure that the thickness of the nanochannel layer 28 is not too thick for phonon confinement. Further, there should be acoustic mismatches between the nanochannel layer 28 and the respective first and second barrier layers 26, 30. The first and second barrier layers 26, should be acoustically harder than the nanochannel layer 28. The acoustic mismatch $\zeta = \eta_{barriershell}/\eta_{nanochannellayer}$ should be greater than approximately 1.5, and preferably greater than about 2. Again, the acoustic impedances used to calculate the acoustic mismatch may use longitudinal or transverse sound velocities. In certain embodiments, as long as the acoustic mismatch for either the longitudinal or transverse sound velocities is larger than 1.5 and preferably larger than 2, sufficient phonon confinement will occur, assuming the thickness of the nanochannel layer 28 is in the order of the thermal phonon wavelength $\lambda_0$ of the material used to form the nanochannel layer 28. The planar architectures also exhibit excellent thermal performance, because the barrier shell provided by the first and second barrier layers 26, 30 efficiently transfers heat away from the channel formed within the nanochannel layer 28.

Those skilled in the art will recognize improvements and modifications to the preferred embodiments of the present invention. All such improvements and modifications are considered within the scope of the concepts disclosed herein and the claims that follow.

What is claimed is:

1. A transistor having high carrier mobility comprising:
   a drain structure;
   a source structure;
   a channel formed of a channel material and extending between the drain structure and the source structure, wherein at least one of a thickness and a diameter of the channel is in an order of a thermal phonon wavelength of the channel material;
   a barrier shell formed of a barrier shell material having an acoustic impedance of at least 2 times an acoustic impedance of the channel material that at least substantially surrounds a portion of the channel such that the barrier shell confines acoustic phonons in the channel material of the channel;
   a gate structure; and
   a gate insulator between a portion of the gate structure and the barrier shell.

2. The transistor of claim 1 wherein the acoustic impedances of the barrier shell material and the channel material are at least one of a group consisting of
- transverse acoustic impedances based on transverse sound velocities of the barrier shell material and the channel material; and
- longitudinal acoustic impedances based on longitudinal sound velocities of the bather shell material and the channel material.

3. The transistor of claim 1 wherein the barrier shell sufficiently confines acoustic phonons in the channel material of the channel, such that atomic vibrations in a crystalline lattice structure of the channel material in the channel are substantially reduced to decrease charge carrier scattering within the channel and thus improve carrier mobility through the channel.

4. The transistor of claim 1 wherein the channel is a cylindrical nanometer-scale semiconductor wire.

5. The transistor of claim 4 wherein the barrier shell is substantially cylindrical and at least substantially surrounds the cylindrical nanometer-scale semiconductor wire.

6. The transistor of claim 5 wherein at least a portion of the gate structure at least substantially surrounds the barrier shell.

7. A transistor having high carrier mobility comprising:
- a drain structure;
- a source structure;
- a channel formed of a channel material and extending between the drain structure and the source structure, wherein at least one of a thickness and a diameter of the channel is in an order of a thermal phonon wavelength of the channel material;
- a barrier shell formed of a barrier shell material having an acoustic impedance of at least 2 times an acoustic impedance of the channel material that at least substantially surrounds a portion of the channel such that the barrier shell confines acoustic phonons in the channel material of the channel;

wherein the transistor further comprises:
- a substrate layer;
- a first barrier layer over the substrate layer;
- at least one channel layer on the first barrier layer;
- a second barrier layer on the at least one channel layer; and
- a gate structure over the second barrier layer, wherein portions of the first and second barrier layers together form the barrier shell, and a portion of the at least one channel layer forms the channel.

8. The transistor of claim 7 further comprising a gate insulator formed between the second barrier layer and the gate structure.

9. The transistor of claim 1 wherein the barrier shell completely surrounds a portion of the channel.

10. The transistor of claim 1 wherein the channel material is formed from at least one of a group consisting of silicon (Si); germanium (Ge); gallium arsenide (GaAs); indium arsenide (InAs); indium antimonide (InSb); gallium nitride (GaN) and other semiconductors with suitable electronic properties.

11. The transistor of claim 1 wherein the barrier shell is a dielectric barrier shell formed from at least one of a group consisting of diamond, diamond-like carbon, crystalline diamond, nanocrystalline diamond, microcrystalline diamond, polycrystalline diamond, tetrahedral amorphous carbon, graphite or graphene-type materials.

12. The transistor of claim 1 wherein the barrier shell is formed from at least one of a group consisting of sapphire, alumina ($Al_2O_3$), silicon nitride ($Si_3N_4$), silicon carbide (SiC), aluminum nitride (AlN), gallium nitride (GaN), zirconium dioxide ($ZrO_2$), calcium oxide (CaO) and other hard insulating or wide-band gap materials, which are acoustically harder than the corresponding channel material.

13. The transistor of claim 1 wherein the channel material is silicon (Si), and at least one of the thickness and the diameter of the channel is on the order of 1 to 10 nanometers (nm).

\* \* \* \* \*